United States Patent
Fryer et al.

(10) Patent No.: US 7,037,769 B2
(45) Date of Patent: May 2, 2006

(54) THIN FILM TRANSISTOR AND MULTILAYER FILM STRUCTURE AND MANUFACTURING METHOD OF SAME

(75) Inventors: Peter M. Fryer, Yorktown Heights, NY (US); Robert L. Wisnieff, Ridgefield, CT (US); Takatoshi Tsujimura, Fujisawa (JP)

(73) Assignee: International Business Machines Corporation, Armonk, NY (US)

(*) Notice: Subject to any disclaimer, the term of this patent is extended or adjusted under 35 U.S.C. 154(b) by 82 days.

(21) Appl. No.: 10/890,759

(22) Filed: Jul. 14, 2004

(65) Prior Publication Data

US 2005/0045889 A1 Mar. 3, 2005

Related U.S. Application Data

(62) Division of application No. 09/604,430, filed on Jun. 27, 2000, now Pat. No. 6,791,144.

(51) Int. Cl.
*H01L 21/00* (2006.01)
*G02F 1/136* (2006.01)

(52) U.S. Cl. ............... 438/149; 438/479; 438/517; 257/66; 257/347; 349/43; 349/44; 349/46; 349/47

(58) Field of Classification Search ............ 349/43, 349/44, 46, 47, 59; 257/347, 66, 69; 438/149, 438/479, 517
See application file for complete search history.

(56) References Cited

U.S. PATENT DOCUMENTS

| 5,512,131 A | 4/1996 | Kumar et al. |
| 6,043,859 A | 3/2000 | Maeda |
| 6,191,530 B1 | 2/2001 | Fukuta et al. |

FOREIGN PATENT DOCUMENTS

| JP | 64-53501 | 3/1989 |
| JP | 64-54025 | 3/1989 |
| JP | 64-56939 | 3/1989 |
| JP | 64-57021 | 3/1989 |
| JP | 64-183775 | 7/1989 |
| JP | 64-184381 | 7/1989 |
| JP | 3-76083 | 4/1991 |
| JP | 3-76405 | 4/1991 |

*Primary Examiner*—Donghee Kang
(74) *Attorney, Agent, or Firm*—Scully, Scott, Murphy & Presser, P.C.; Robert M. Trepp, Esq.

(57) ABSTRACT

The present invention is directed to a thin film transistor (and related multilayer structures) that includes: source and drain electrodes 14 and 15 disposed at a specified interval above an insulating substrate 11 and formed by printing-and-plating; an a-Si film 16 disposed for the source and drain electrodes 14 and 15; a gate insulating film 17 laminated on the a-Si film 16; and a gate electrode 18 laminated on the gate insulating film 17 and formed by printing-and-plating. The a-Si film 16 and the gate insulating film 17 have an offset region 20 that uniformly extends beyond the dimensions of the gate electrode 18.

12 Claims, 4 Drawing Sheets

THIN FILM TRANSISTOR AND MULTILAYER FILM STRUCTURE AND MANUFACTURING METHOD OF SAME

The present application is a divisional of application Ser. No. 09/604,430 filed on Jun. 27, 2000 now U.S. Pat. No. 6,791,144, the entire contents of which is incorporated herein by its reference.

BACKGROUND OF THE INVENTION

The present invention relates to a thin film transistor used for a liquid crystal display of an active matrix system or the like. The invention also relates to methods for manufacturing a multilayer film structure and the thin film transistor.

The liquid crystal display of an active matrix system that uses a thin film transistor is constructed in a manner that a gate electrode (Y electrode) and a data electrode (X electrode) are disposed in a matrix form, and a liquid crystal is sealed in between a TFT array substrate having a thin film transistor (TFT) disposed at an intersection thereof and an opposite substrate laminated by keeping a gap with the TFT array substrate. The liquid crystal display can perform displaying by using the thin film transistor to control a voltage applied to the liquid crystal, and also by using an electro-optical effect provided by the liquid crystal.

Conventionally known thin film transistor structures include a top gate type (positive stagger type) and a bottom gate type (negative stagger type). A thin film transistor of the top gate type has a light shielding film formed on an insulating substrate such as a glass board, and an insulating film formed thereon, which is made of a silicon oxide SiOx, a silicon nitride SiNx or the like. On the insulating film, drain and source electrodes made of ITO (Indium and Tin Oxide) films are disposed by keeping a channel space. Then, an amorphous silicon film (a-Si film) is formed to cover the two electrodes, and a gate insulating film made of SiOx, SiNx or the like is formed on the a-Si film. On the gate insulating film, a gate electrode is provided. Accordingly, an island region called an a-Si island is formed. On the other hand, a thin film transistor of the bottom gate type has a gate electrode provided on an insulating substrate, and a gate oxide film and an amorphous silicon film (a-Si film) are provided on the gate electrode in this order. Then, source and drain electrodes are formed, and a protective film is formed thereon.

FIGS. 4(a) to 4(g) illustrate respective steps of manufacturing a conventional thin film transistor by taking an example of the bottom gate type. As a typical process of manufacturing the conventional thin film transistor, a 7 PEP (Photo Engraving Process) structure is available. In accordance with the 7 PEP structure, first in 1 PEP, as shown in FIG. 4(a), an alloy film made of tantalum (Ta) or molybdenum tantalum (MoW), or a metallic film made of aluminum (Al) is formed on a cleaned glass board 101 by sputtering, and a gate electrode 102 and a capacitor (Cs) electrode 103 are patterned. Then, in 2 PEP, as shown in FIG. 4(b), a gate insulating film 104 made of SiOx or SiNx is formed by a plasma CVD (Chemical Vapor Deposition) technology or the like. Subsequently, by plasma CVD, an a-Si film 105 as a semiconductor film and an etching protective film 106 made of SiNx are continuously laminated, and the etching protective film 106 is formed by patterning. Then, in 3 PEP, as shown in FIG. 4(c), a semiconductor layer (a-Si layer) is formed by patterning only a portion of the a-Si film 105 that will be a TFT.

Then, in 4 PEP, as shown in FIG. 4(d), a pixel electrode (transparent electrode) 107 is formed by sputtering an ITO film (Indium Tin Oxide film) as a transparent electrode on a portion to become a pixel electrode. On the other hand, in 5 PEP, as shown in FIG. 4(e), to form an electrode section of an storage capacitor (Cs), a part of the gate insulating film 104 on the Cs electrode 103 is subjected to patterning, and removed. Then, in 6 PEP, as shown in FIG. 4(f), a source electrode 108, a drain electrode 109 and a Cs electrode 110 are formed by sputtering and then patterning metal such as aluminum (Al) or titanium (Ti). Lastly, as shown in FIG. 4(g), a nitride film (SiNx) is grown by CVD to protect an element such as a TFT. Then, this film is subjected to patterning to form a protective film 111. A TFT is then completed by performing characteristic checking.

However, since the conventional 7 PEP structure requires a number of steps and the process itself becomes complex, manufacturing costs become high. In other words, investments are costly because of very high prices of forming the films using the complex PEP processes. For example, in the conventional TFT manufacturing process shown in FIG. 4, since all the patterning operations use resist exposure, an exposure device is necessary. Also, since the metallic layer is formed by sputtering, a sputtering device is necessary. Any of these devices is very high in price in the order of 500 to 800 million yen per unit, and has a plurality of layers. To meet a throughput requirement, several to several tens of these devices must be installed. The installation of the devices amounts to a considerable portion of investments in the order of several to several tens of billion yen, which is needed to prepare a new liquid crystal display line. Thus, improvements in the manufacturing process have been strongly demanded.

To improve the process, several technologies have conventionally been presented: e.g., Japanese Patent Laid-Open Hei 2 (1990)-232935, Patent Laid-Open Hei 2 (1990)-237039, U.S. Pat. No. 2,778,133, Patent Laid-Open Hei 4 (1992)-309927. In accordance with these Publications, an electrode of conductive material is formed by plating, and the steps of vacuum deposition and photolithography are omitted. Thus, manufacturing costs can be reduced. For the purpose of improving the manufacturing process based on the foregoing 7 PEP structure, for example, in Japanese Patent Application Hei 11 (1999)-214603, the inventors already disclosed the technology to improve the manufacturing process based on the 4 PEP structure. In accordance with this technology, for example, in the TFT of a top gate type, by using a pattern of a gate electrode as a mask, one patterning step is carried out to continuously etch the gate electrode, a gate insulating film and an a-Si film. This invention is very effective in that the manufacturing process can be shortened.

SUMMARY OF THE INVENTION

The present invention was made in order to solve the foregoing technical problems.

It is an object of the invention to greatly improve a manufacturing process for a multilayer film structure of a thin film transistor or the like.

Another object of the invention is to reduce current leakage between electrodes by forming an offset region in a manufactured multilayer film structure.

Yet another object of the invention is to provide a multilayer film structure, where offset lengths of formed offset regions are uniform.

In order to achieve the foregoing objects, a thin film transistor of the present invention comprises: source and drain electrodes disposed at a specified interval on an insulating substrate; a semiconductor layer electrically couples the source and drain electrodes; a gate insulating film is disposed between the semiconductor layer and a gate electrode. The semiconductor layer and the gate insulating film have offset regions, which are located around the gate electrode but extend beyond the dimensions of the gate electrode. The drain electrode, source electrode, and/or gate electrode are formed by printing-and-plating.

In top-gate style TFTs, patterning of the semiconductor layer and the gate insulating film is preferably accomplished by plating a sacrificial layer on the gate electrode and subjecting the structure to an etchant that etches the gate insulating film and semiconductor layer and removes the sacrificial layer. Using plating to form the sacrificial layer enables widths of offset regions to be uniform (substantially equal), and is preferable because of its ability to properly prevent surface leakage between the gate electrode and the source/drain electrodes. In addition, the source and drain electrodes may be formed by printing-and-plating. The plated formation of these electrodes can eliminate the necessity of using a technology of photolithography, and is advantageous in that the process can be simplified enables investment costs to be reduced more greatly. This reduces the costs for manufacturing the TFT structure.

The invention should not be limited to the structure of a top gate type as a thin film transistor structure. For example, it can also be applied to the structure of a bottom gate type thin film transistor. Also, it can be used in a laminated structure or in a contact or non-contact type structure.

A multilayer film structure of the present invention comprises: a first metal layer that is formed by printing-and-plating and disposed above a substrate; an insulating layer disposed between the first metal layer and a second metal layer formed by printing-and-plating.

Preferably, the insulating layer is patterned by plating a sacrificial layer on the second metal layer and subjecting the structure to an etchant that etches the insulating film and removes the sacrificial layer, thereby forming an offset region in the insulating film that extends beyond the dimensions of the second metal layer. Using plating to form the sacrificial layer enables the offset regions to be uniform (substantially equal), and is preferable because of its ability to properly prevent surface leakage between the first metal layer and the second metal layer. Also, the metallic layers can be easily formed.

Moreover, formation of the conductive layers of TFT devices and multilayer devices by printing-and-plating enables investment costs to be reduced greatly. As a result, costs for manufacturing such devices can be greatly reduced.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

Next, description will be made for detail of the preferred embodiments of the present invention with reference to the accompanying drawings.

Figure 1A:
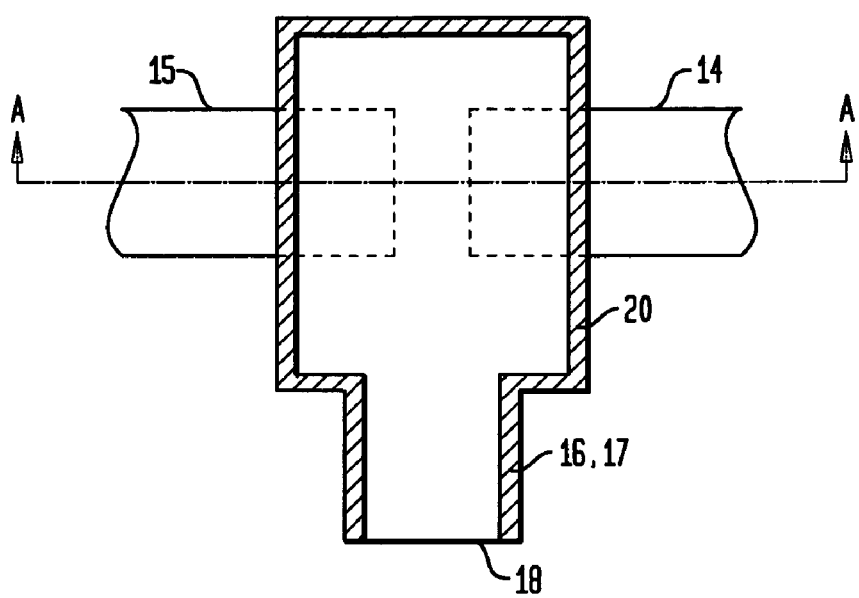
FIGS. 1(a) and 1(b) are views, each of which shows a thin film transistor (TFT) constitution of the first embodiment of the present invention.
Figure 1B:
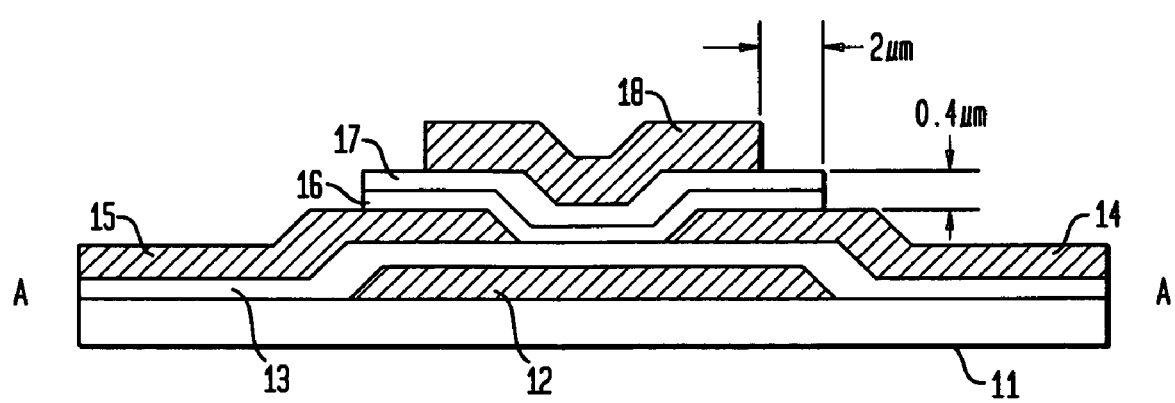

Each of FIGS. 1(a) and 1(b) is a view showing a thin film transistor (TFT) structure of the embodiment 1 of the present invention, by taking an example of a TFT of a top gate type. Specifically, FIG. 1(a) shows a state of the TFT when seen from above, which is manufactured in a shortened process by a later-described manufacturing method; and FIG. 1(b) shows an A—A section of FIG. 1(a).

As shown in FIG. 1(b), the TFT of the embodiment comprises a light shielding film (light shield) 12 formed on an insulating substrate 11 made of no-alkali glass, quartz or the like, and an insulating film 13 formed as an undercoated layer to cover the upper portion thereof, the undercoated layer being made of an oxidized silicon nitride film SiOxNy or the like. Preferably, the light shielding film 12 is formed by printing-and-plating copper (CU). On the insulating film 13, source and drain electrodes 14 and 15 are formed. Preferably, the source and drain electrodes are formed by printing-and-plating cobalt (Co). On the source and drain electrodes 14 and 15, an a-Si film 16 is deposited to form a semiconductor layer. A gate insulating film 17 made of silicon nitride SiNx is deposited on the a-Si film 16. Further, on the gate insulating film 17, a gate electrode 18 is formed. Preferably, the gate electrode 18 comprises nickel (Ni) formed by printing-and-plating.

In accordance with the embodiment, for the purpose of shortening the process, as described later, a sacrifice layer is formed on the gate electrode by plating, and simultaneous etching is performed by using the sacrifice layer as a mask to pattern the a-Si film 16 and the gate insulating film 17.

There are various print-and-plating methods that one can use to form the printed-and-plated metal layers of the present invention. An example may be a method, comprising the steps of: printing a pattern of palladium (Pd) ink or the like as a metal having low specific resistance; and then covering the ink using an electrolytic or electroless plating method in a liquid phase so as to set the metal of low specific resistance as a nucleus.

In accordance with the embodiment, by performing etching for the a-Si film 16 and the gate insulating film 17 with the sacrifice layer as a mask, an offset region 20 is formed around the gate electrode 18. A plate has a characteristic of isotropic growth. Thus, by performing etching after the formation of the sacrifice layer by plating, the offset region 20 can be formed to have uniform dimensions. With the embodiment, the offset region 20 is formed to have a width of about 2 μm around the gate electrode 18. The width of this offset region 20 can be controlled based on time necessary for plating.

If etching is directly performed for the a-Si film 16 and the gate insulating film 17 by using the gate electrode 18 as a mask without employing the embodiment, a total height of the a-Si film 16 and the gate insulating film 17 will be only about 0.4 μm. Consequently, a short circuit may occur because of surface leakage between the gate electrode 18 and the other electrode. In accordance with the embodiment, however, since the offset region 20 is formed to have a width of about 2 μm around the gate electrode 18 plated with nickel, a distance between the gate electrode 18 and the other electrode is longer and, thus, the occurrence of a short circuit by surface leakage can be suppressed.

Next, description will be made for a manufacturing process of the thin film transistor (TFT) of the embodiment by taking an example of a TFT of a top gate type and with reference to FIGS. 2(a) to 2(e).

Figure 2A:
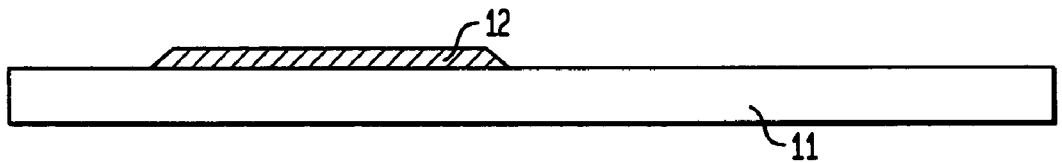
FIGS. 2(a) to 2(e) are views showing respective steps of a process for manufacturing a thin film transistor (TFT) of the first embodiment.

As shown in FIG. 2(a), first, an insulating substrate 11 such as a glass board is cleaned by using mechanical cleaning such as brush cleaning (scrubbing), alternatively chemical cleaning using acid, organic solution or the like. Then, printing by palladium (Pd) ink and plating by copper (Cu) are performed to form a light shielding layer (light shield) 12 as a first plating layer.

Figure 2B:
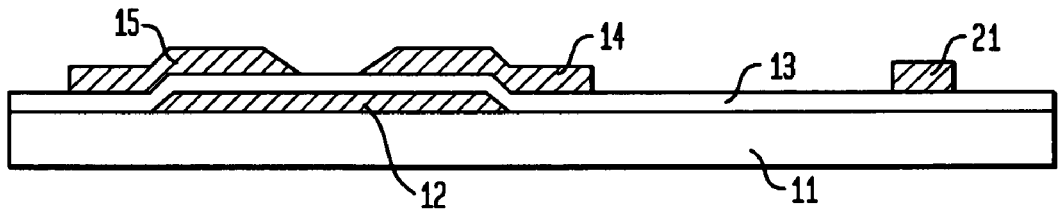

Subsequently, as shown in FIG. 2(b), as an interlayer insulating film, an insulating film 13 made of highly adhesive oxidized silicon nitride film (SiOxNy) is formed by a plasma CVD method. Then, printing by palladium (Pd) ink and plating by cobalt (Co) are performed to form a source and drain electrodes 14 and 15 as a second plated layer. Simultaneously, a capacitor (Cs) electrode 21 is formed. With the embodiment, an In-Plane Switching (IPS) mode is employed, and the process is shortened by eliminating the use of a transparent electrode as a pixel electrode.

Figure 2C:
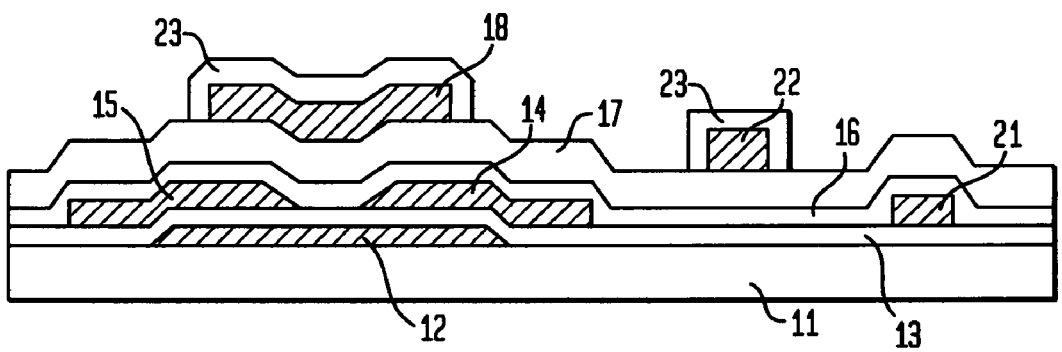

Then, as shown in FIG. 2(c), $PH_3$ plasma processing is performed to form a contact. An a-Si film 16 is then deposited as a semiconductor material by plasma CVD, and a gate insulating film 17 made of silicon nitride (SiNx) is subsequently deposited by plasma CVD. Further, printing by palladium (Pd) ink and plating a metal layer (such as cobalt-phosphorous (Co—P)) are performed to form a gate electrode 18 and a gate line 22 as a third plated layer.

In accordance with the embodiment, plating a metal layer (such as copper (Cu)) is performed on the gate electrode 18 and the gate line 22 formed in the above plating step to form sacrifice layers 23 as fourth plated layers. Since the sacrifice layers 23 are formed in the plating step, the layers can be formed by selecting the gate electrode 18 and the gate line 22 as a target metallic layers. Because of a plate characteristic, the sacrifice layers 23 are formed not only on the gate electrode 18 and the gate line 22 but also on side end surfaces. Also, because of a plate characteristic, the layers are grown to be uniform (isotropic) in thickness. As a result, the sacrifice layers 23 equal in thickness can be formed around the gate electrode 18 and the gate line 22 including the end surfaces. In this step, plating time is adjusted in order to set a thickness of each sacrifice layer 23 to about 2 μm.

Figure 2D:
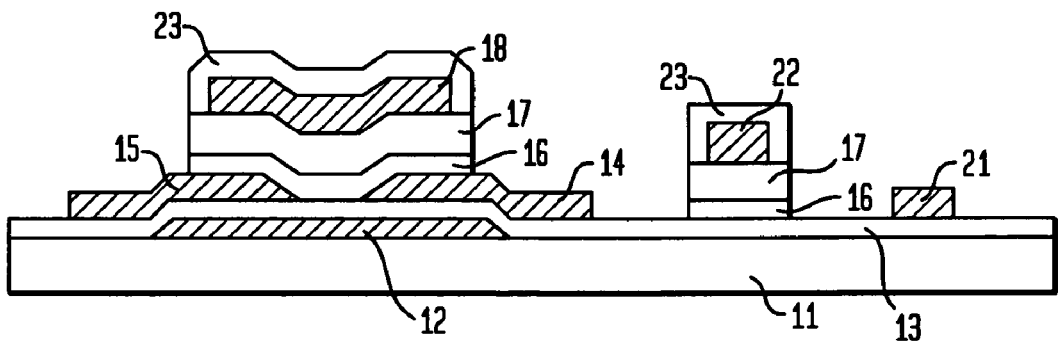

Subsequently, in FIG. 2(d), etching is performed for the a-Si film 16 and the gate insulating film 17 by using the sacrifice layer 23 as a mask. The etching enables a required island cut to be formed. Accordingly, compared with the process of the conventional 7 PEP, the forming steps of the a-Si film 16 and the gate insulating film 17 can be reduced. In other words, since etching is continuously performed for these films by one step, a manufacturing process can be greatly shortened. Moreover, since the sacrifice layer 23 is used as a mask in the etching step, a uniform distance equal to the thickness of the sacrifice layer can be set between an end of the island cut and the gate electrode 18.

Figure 2E:
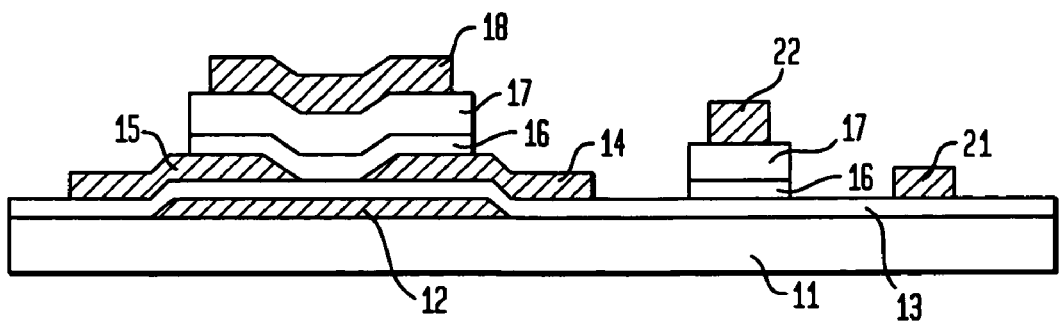

Then, as shown in FIG. 2(e), selective etching is performed for the copper (Cu) plated sacrifice layer 23 by mixed liquid containing phosphoric acid, nitric acid and acetic acid. Then, the gate electrode 18 and the gate line 22 are exposed.

The foregoing series of steps enable the TFT to be formed without using PEP or sputtering at all. Thus, investment costs can be greatly reduced, and costs for an LCD display can also be reduced greatly. The sacrifice layer 23 enables a uniform offset region 20 like that shown in FIG. 1 to be formed. Thus, it is possible to prevent a short circuit between the gate electrode 18 and the source/drain electrodes 14 and 15, and to secure yield.

According to the embodiment, the sacrifice layer 23 is formed by plating for the gate electrode 18 formed by plating. However, the present invention is not limited in this respect. For example, the sacrifice layer 23 (and not the gate electrode) may be formed by plating. But the formation of the gate electrode 18 by plating is very effective for shorting the process. On the other hand, if patterning is executed to form an island cut by forming a resist mask in the gate electrode 18 formed by plating, alignment shifting tends to occur. Consequently, setting of left and right lengths of the offset region 20 to be equal will be difficult, and expected suppression of a short circuit caused by surface leakage will be difficult. It can therefore be understood that as in the case of the embodiment, the formation of the sacrifice layer 23 by plating for the plated gate electrode 18 and the formation of the island cut by using the sacrifice layer 23 as a mask are most preferable for shortening the process and securing yield by keeping stable quality.

The description above illustrates an embodiment of the present invention in a TFT of a top gate type. Next, description will be made for a second embodiment of the present invention in a TFT of a bottom gate type and another multilayer film structure, to which the present invention is applied.

Figure 3A:
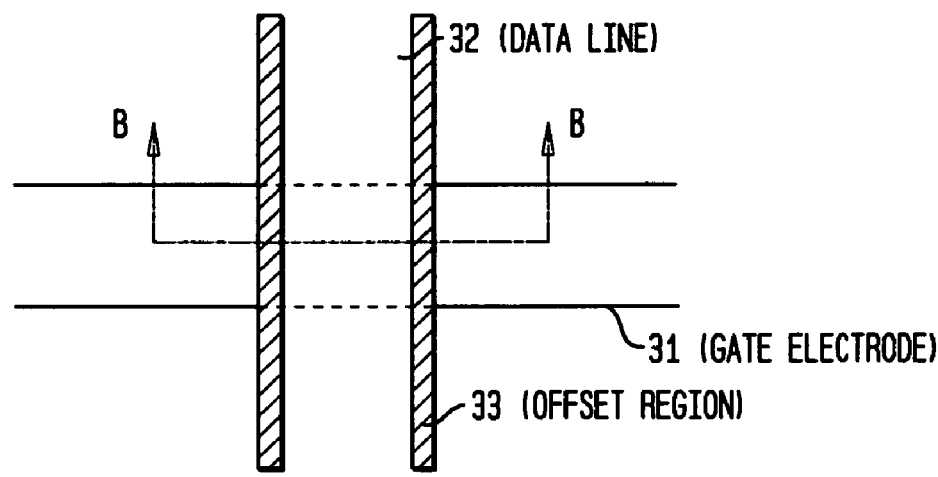
FIGS. 3(a) and 3(b) are views, each of which illustrates a constitution of the second embodiment of the present invention.
Figure 3B:
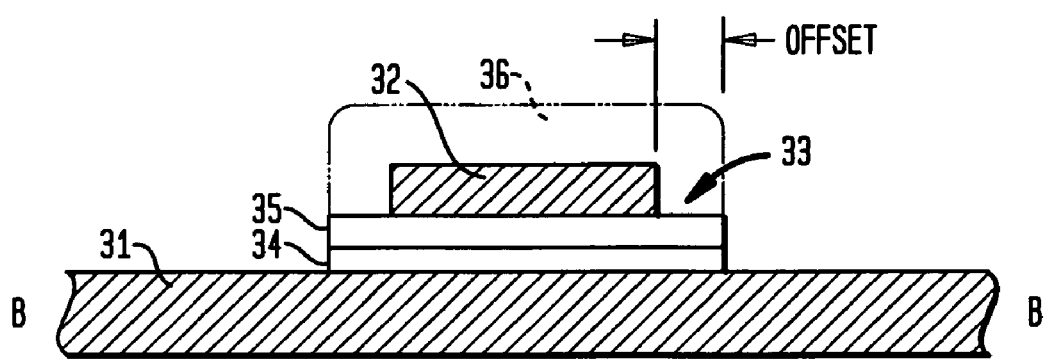
Figure 4A:
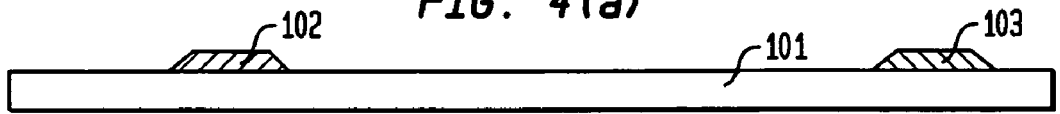
FIGS. 4(a) to 4(g) are views showing respective steps of a process for manufacturing a conventional thin film transistor, taking an example of a bottom gate type.
Figure 4B:
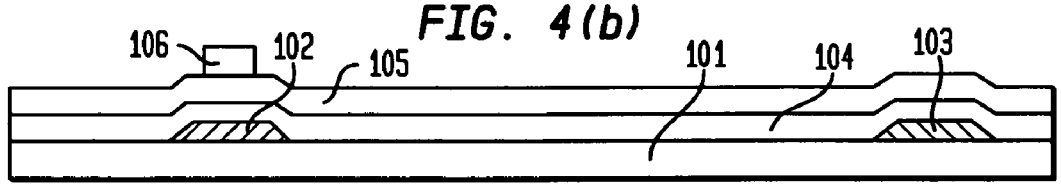
Figure 4C:
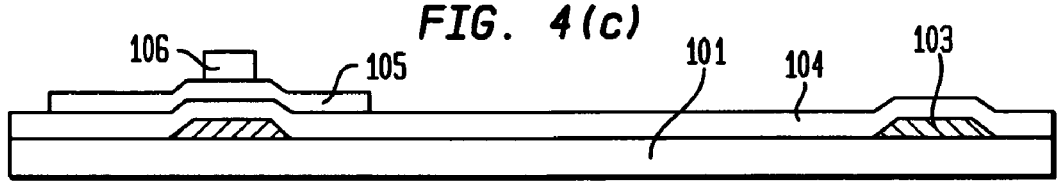
Figure 4D:
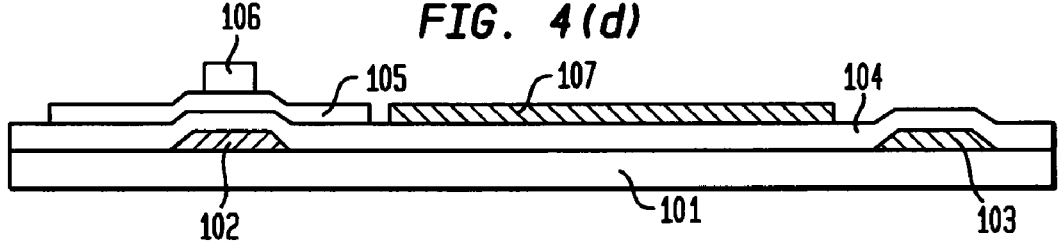
Figure 4E:
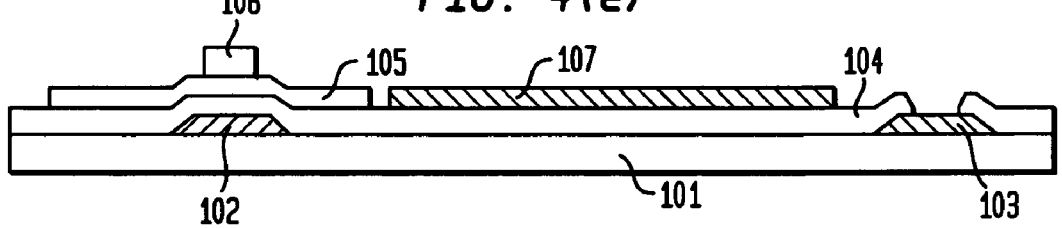
Figure 4F:
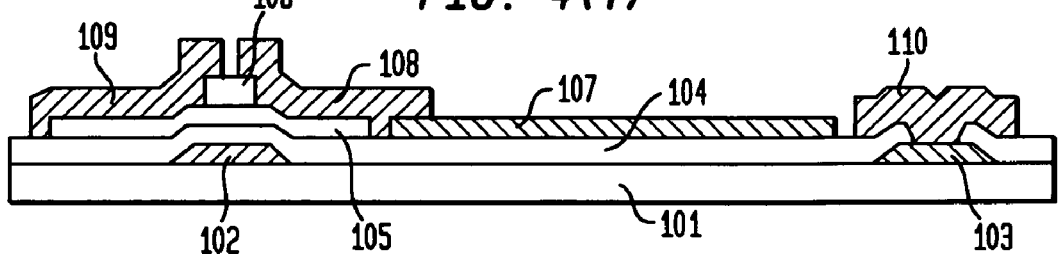
Figure 4G:
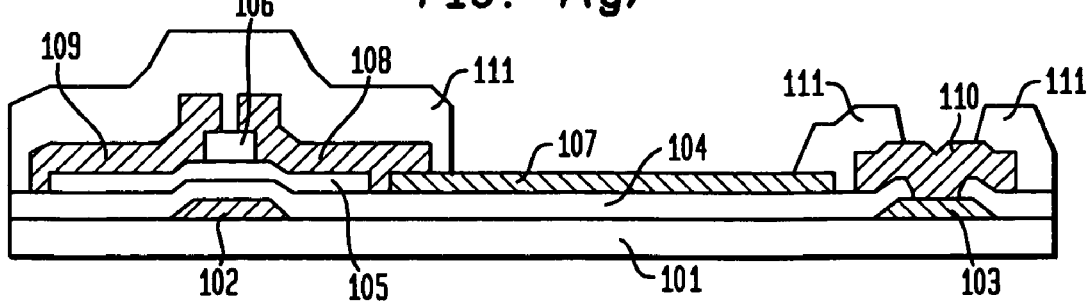

Each of FIGS. 3(a) and 3(b) is a view illustrating a constitution of this second embodiment. FIG. 3(a) shows the state where the gate electrode 31 and the data line 32 cross to each other. FIG. 3(b) shows a B—B section of FIG. 3(a). In the multilayer film structure of the embodiment, as shown in FIG. 3(b), an a-Si film 34 and a gate insulating film 35 are formed on a gate electrode 31, and a data line 32 is formed on the gate insulating film 35. If an end surface of the data line 32 coincides with an etching end surface of the a-Si film 34 or the gate insulating film 35, then a short circuit may occur between the gate electrode 31 and the data line 32 at a crossing position like that shown in FIG. 3(a). Thus, in the embodiment, an offset region 33 is provided for the end surface of the data line 32, and a-Si film 34 and the gate insulating film 35 are subjected to etching.

Further, in accordance with the embodiment, as in the case of the gate electrode 18 and the sacrifice layer 23 of the first embodiment, the data line 32 is plated with, for example, nickel (Ni), and a sacrifice layer 36 plated with copper (Cu) is formed thereon. Then, etching is performed for the a-Si film 34 and the gate insulating film 35 by using the sacrifice layer 36 as a mask. Subsequently, selective etching is performed for the sacrifice layer 36 plated with copper (Cu) by mixed liquid containing phosphoric acid, nitric acid and acetic acid, and the data line 32 plated with nickel (Ni) is exposed. A series of these manufacturing steps enable an offset having a uniform length to be formed in the offset region 33. Accordingly, a short circuit can be prevented from occurring at an intersection between the gate electrode 31 and the data line 32. Also, as in the case of the first embodiment, the formations of the data line 32 and the sacrifice layer 36 by plating and etching performed for the gate insulating film 35 and the a-Si film 34 enable the manufacturing process to be greatly shortened.

As apparent from the description of the second embodiment, the present invention can be applied not only to the TFT constitution of a top gate type of the first embodiment but also to the TFT constitution of a bottom gate type and the other multilayer film structure. In other words, because of the plated structure provided in the wiring portion, even if the electrode, the line, and so on, are protruded in the wiring portion, a short circuit can be prevented between the electrodes, between the lines or between the line and the electrode by forming the offset region by means of the plated sacrifice layer.

As described above, the present invention is advantageous in that the manufacturing process can be greatly improved for the multilayer film structure of the thin film transistor or the like. The invention is also advantageous in that in the manufactured multilayer film structure, the formation of the offset region enables the occurrence of current leakage to be reduced between the electrodes, between the lines or between the line and the electrode.

The invention is advantageous for facilitating the formation of the multilayer film structure where the offset length of the offset region to be formed is uniform.

Although the preferred embodiments of the present invention have been described in detail, it should be understood that various changes, substitutions and alternations can be made therein without departing from spirit and scope of the inventions as defined by the appended claims.

What is claimed is:

1. A method for forming a transistor device comprising the steps of:
    providing a substantially transparent substrate;
    forming a first patterned conductive layer disposed above the substrate to form a source electrode and a drain electrode;
    forming a semiconductor layer electrically coupling the source electrode and the drain electrode; and
    forming a second patterned conductive layer disposed above the substrate and above the semiconductor layer to form a gate electrode;
    forming one of the source electrode, the drain electrode, and the gate electrode by printing an ink layer and plating a layer of conductive material onto the ink layer.

2. The method of claim 1, further comprising the step of forming a light shield layer disposed between the transparent substrate and the semiconductor layer.

3. The method of claim 2, including forming the light shield layer by printing an ink layer and plating a layer of light shielding material onto the ink layer.

4. The method of claim 2, including forming the light shield layer as a light shielding composite structure comprising a printed pattern of conductive metal ink layer covered by a plated layer of metal.

5. The method of claim 1, including forming each of the source electrode, the drain electrode, and the gate electrode by printing an ink layer and plating a layer of conductive material onto the ink layer.

6. The method of claim 1, further comprising the step of forming an insulating film disposed between the gate electrode and the semiconductor layer.

7. The method of claim 6, further comprising the step of patterning the insulating film and the semiconductor film to form an offset region of the insulating film and the semiconductor film that extends beyond at least one edge of the gate electrode and separates the gate electrode from the source and drain electrodes of the transistor.

8. The method of claim 7, including patterning the insulating film and the semiconductor film by:
    plating a sacrificial layer onto the gate electrode; and
    exposing the insulating film, the semiconductor film and the sacrificial layer to an etchant.

9. The method of claim 1, wherein the step of printing an ink layer comprises printing a pattern of ink.

10. The method of claim 1, wherein the step of printing an ink layer comprises printing a pattern of conductive metal ink.

11. The method of claim 1, including forming one of the source electrode, the drain electrode, and the gate electrode as a composite structure of a printed pattern of conductive metal ink layer covered by a plated layer of metal.

12. The method of claim 1, including forming each of the source electrode, the drain electrode, and the gate electrode as a composite structure of a printed pattern of conductive metal ink layer covered by a plated layer of metal.

* * * * *